United States Patent [19]

Furutani et al.

[11] Patent Number: 5,132,930
[45] Date of Patent: Jul. 21, 1992

[54] CMOS DYNAMIC MEMORY DEVICE HAVING MULTIPLE FLIP-FLOP CIRCUITS SELECTIVELY COUPLED TO FORM SENSE AMPLIFIERS SPECIFIC TO NEIGHBORING DATA BIT LINES

[75] Inventors: Kiyohiro Furutani; Koichiro Mashiko; Kazutami Arimoto; Noriaki Matsumoto; Yoshio Matsuda, all of Itami, Japan

[73] Assignee: Mitsubishi Denki Kabushiki Kaisha, Tokyo, Japan

[21] Appl. No.: 577,062

[22] Filed: Sep. 4, 1990

Related U.S. Application Data

[63] Continuation of Ser. No. 379,664, Jul. 13, 1989, abandoned, which is a continuation of Ser. No. 76,223, Jul. 22, 1987, abandoned.

[30] Foreign Application Priority Data

Jul. 31, 1986 [JP] Japan .................. 61-180598
Jul. 31, 1986 [JP] Japan .................. 61-180599

[51] Int. Cl.$^5$ .......................................... G11C 11/409
[52] U.S. Cl. .................................. 365/205; 365/181; 365/190; 365/233; 307/530
[58] Field of Search ............ 365/51, 149, 181, 189.02, 365/189.05, 190, 205, 207, 208, 230.03, 233; 307/530

[56] References Cited

U.S. PATENT DOCUMENTS

| | | | |
|---|---|---|---|
| 4,085,457 | 4/1978 | Itoh ................................. | 365/205 |
| 4,274,147 | 6/1981 | Padgett et al. .................. | 365/205 |
| 4,584,672 | 4/1986 | Schutz et al. ................... | 365/205 |
| 4,648,074 | 3/1987 | Pollachek ........................ | 365/184 |
| 4,730,280 | 3/1988 | Aoyama .......................... | 365/190 |
| 4,739,500 | 4/1988 | Miyamoto et al. .............. | 365/207 |
| 4,792,927 | 12/1988 | Miyamoto et al. .............. | 365/149 |

FOREIGN PATENT DOCUMENTS 0142591 6/1986 Japan .................. 365/205

OTHER PUBLICATIONS

Denshi Zairya (Electronics Materials), Jan. 1986, pp. 41-42.
IEEE, International Solid State Circuits Conference, Digest of Tech. Papers, ISSCC 84, Session XVIII: 256K/1Mb DRAMS-II; FAM 18.6: pp. 282-283.
"An Experimental 1Mb DRAM with On-Chip Voltage Limiter", Feb. 1984.

*Primary Examiner*—Glenn Gossage
*Attorney, Agent, or Firm*—Fleit, Jacobson, Cohn, Price, Holman & Stern

[57] ABSTRACT

In a metal-oxide semiconductor (MOS) dynamic formed on a semiconductor substrate, data nodes of a first flip-flop are connected to a first pair of folded bit lines. Its power supply node is connected through a switch to a first power supply (Vss). Data nodes of a second flip-flop are connected to a second pair of folded bit lines. Its power supply node is connected through a switch to the first power supply (Vss). A power supply node of a third flip-flop is connected through a switch to a second power supply (Vcc). Data nodes of the third flip-flop are coupled through a first pair of transfer gates to the first pair of the folded bit lines, and through a second pair of transfer gates to the second pair of the folded bit lines. Coupling the first to the third flip-flops forms a first sense amplifier and coupling the second to the third flip-flops forms a second sense amplifier.

6 Claims, 6 Drawing Sheets

CMOS DYNAMIC MEMORY DEVICE HAVING MULTIPLE FLIP-FLOP CIRCUITS SELECTIVELY COUPLED TO FORM SENSE AMPLIFIERS SPECIFIC TO NEIGHBORING DATA BIT LINES

This is a continuation of application Ser. No. 07/379,664, filed Jul. 13, 1989, now abandoned, which in turn is a continuation of Ser. No. 07/076,223, filed Jul. 22, 1987, now abandoned.

BACKGROUND OF THE INVENTION

The present invention relates to a memory metal-oxide semiconductor (MOS) device, particularly to a complementary metal-oxide semiconductor (CMOS) dynamic random access memory (RAM), and more particularly to an improvement to sense amplifiers incorporated therein.

FIG. 1 shows a configuration of a prior art shared sense amplifier shown in a periodical *Denshi Zairyo* (Electronics Materials) January 1986, pp. 41 and 42, particularly FIGS. 4 and 5 therein. As illustrated, it includes bit lines 1, 1', $\overline{\text{bit}}$ lines 7, 7', first and second word lines 2, 2', a column decoder 3, an input/out (I/O) line 4, an $\overline{\text{I/O}}$ line 4', and memory cells M1, M2.

The memory cell M1 comprises a transistor Q1 and a capacitor C1. Similarly, the memory cell M2 comprises a transistor Q2 and a capacitor C2.

FIG. 2 shows a chip architecture of the MOS dynamic RAM employing the sense amplifier configuration of FIG. 1. As illustrated, the chip area includes an area 5 which comprises an area 5a for the sense amplifiers (transistors $Q_{12}$ to $Q_{17}$), an area 5b for I/O gates (transistors $Q_3$, $Q_4$) and an area 5c for bit-line precharge circuits (transistors $Q_9$ to $Q_{11}$). An area 6 is for a row decoder.

In the shared-sense amplifier configuration, one sense amplifier is shared by pairs of bit lines 1, 1' and bit lines 7, 7'. As a result, the chip size and the power consumption can be reduced.

The operation of the memory of FIG. 1 and FIG. 2 will now be described.

The shared-sense amplifier has two operation modes, i.e., a first mode in which a first block A positioned farther away from the column decoder is accessed and a second mode in which a second block B positioned closer to the column decoder is accessed.

First, let us assume that one of the memory cells M1 in the first block A is accessed. It is assumed that the gate signals $\phi_{GE}$ and $\phi_{GI}$ are high and the transistors $Q_5$, $Q_6$, $Q_7$ and $Q_8$ which constitute transfer gates between the bit line pairs 1, 1', 7, 7' and the sense amplifier circuit 5a are therefore conductive so that the bit lines 1 and 7, and the bit lines 1' and 7' are respectively interconnected; and the sense amplifier activation signal $\overline{\phi}_{SAP}$ is high and the sense amplifier activation signal $\phi_{SAN}$ is low so that the sense amplifier circuit 5a is inactive; and the column address signal $\phi_Y$ from the column decoder 3 is low, and the transistors $Q_3$ and $Q_4$ are off, so that the bit lines 1, 1', 7, 7' are disconnected from the I/O lines 4, 4'.

During such time, the transistors $Q_9$, $Q_{10}$ and $Q_{11}$ are conductive by the precharge signal $\phi_{PC}$ and the bit lines 1, 1', 7, 7' are precharged to a preset potential $V_{BL}$ (which is normally Vcc/2).

Next, the precharge signal $\phi_{PC}$ goes low, and the transistors $Q_9$, $Q_{10}$ and $Q_{11}$ are turned off. Then, the gate signal $\phi_{GI}$ goes low, to turn off the transistors $Q_5$ and $Q_6$ and the bit lines of the unselected block B are therefore disconnected from the sense amplifier circuit. After that, the word line 2 is accessed, and the transistor $Q_1$ is turned on, so that the data which has been stored in the memory cell M1 is read out onto the bit line 1'. Thereafter, the sense amplifier activation signal $\overline{\phi}_{SAP}$ goes low and the sense amplifier activation signal $\phi_{SAN}$ goes high to activate the sense amplifier, and the data from the memory cell M1 is amplified on the bit lines 1, 1'. The column address signal $\phi_Y$ thereafter goes high to turn on the transistors $Q_3$ and $Q_4$, so that the data on the bit lines are read out onto the I/O lines 4, 4'.

For writing data which is an inversion of the data that has just been read through the I/O lines, the new data (inversion) is transmitted from the I/O lines, through the transistors $Q_3$ and $Q_4$, to the sense amplifier circuit, the flip-flop associated with the sense amplifier circuit being thereby inverted. The new data is thereby amplified on the bit lines 1, 1' and is written into the memory cell M1.

Similar operations occur when a memory cell M2 in the block B is accessed, and data is written in the memory cell M2.

A disadvantage of the above-described arrangement is explained below:

The column address signal $\phi_Y$ from the column decoder 3 must be supplied from the column decoder 3 situated beyond the end of the bit lines, to the I/O gates (transistors $Q_3$ and $Q_4$) within the area 5. Accordingly, it was necessary to dispose a column address signal line (for $\phi_Y$) to extend between the bit lines, if the column address signal line is formed of the same conductor layer as the bit lines, or to form the column address signal line using a different conductor layer. Moreover, since the column address signal line forms capacitances with the bit lines, it was necessary to make such an arrangement as to avoid imbalance between the capacitances.

SUMMARY OF THE INVENTION

An object of the invention is to eliminate the above problems.

Another object of the invention is to eliminate the need of disposing the column address signal line to extend between the bit lines or to use a different wiring conductor layer.

In a MOS memory device according to the invention, a first flip-flop formed of transistors of a first-channel type is shared by two pairs of bit lines, while a second flip-flop formed of transistors of a second channel type and forming a sense amplifier together with the first flip-flop, is provided for each pair of the bit lines.

The I/O gates are disposed at an end of one of the two pairs of bit lines, adjacent which a column decoder is disposed.

The first flip-flop shared by the two pairs of bit lines is disposed between "inner" ends of the pairs of bit lines.

The second flip-flop can be disposed at an "outer" end of each pair of bit lines farther away from the first flip-flop.

Preferably, the unshared flip-flops, one near the I/O gates and the other farther away from the I/O gates should have different driving powers.

With the above arrangement, it is not necessary to dispose the column address signal line to extend between the bit lines, and although the I/O gates are provided at the ends of the bit lines there is sufficient amplification function to transfer data to the I/O line. In regard to pattern layout, the chip area is about the same as the prior art.

Moreover, the use of the flip-flops with different driving powers eliminates the problem encountered in writing data which is an inversion of the data that has been read out.

DETAILED DESCRIPTION OF THE PREFERRED EMBODIMENTS

Embodiments of the invention will now be described.

Figure 1:
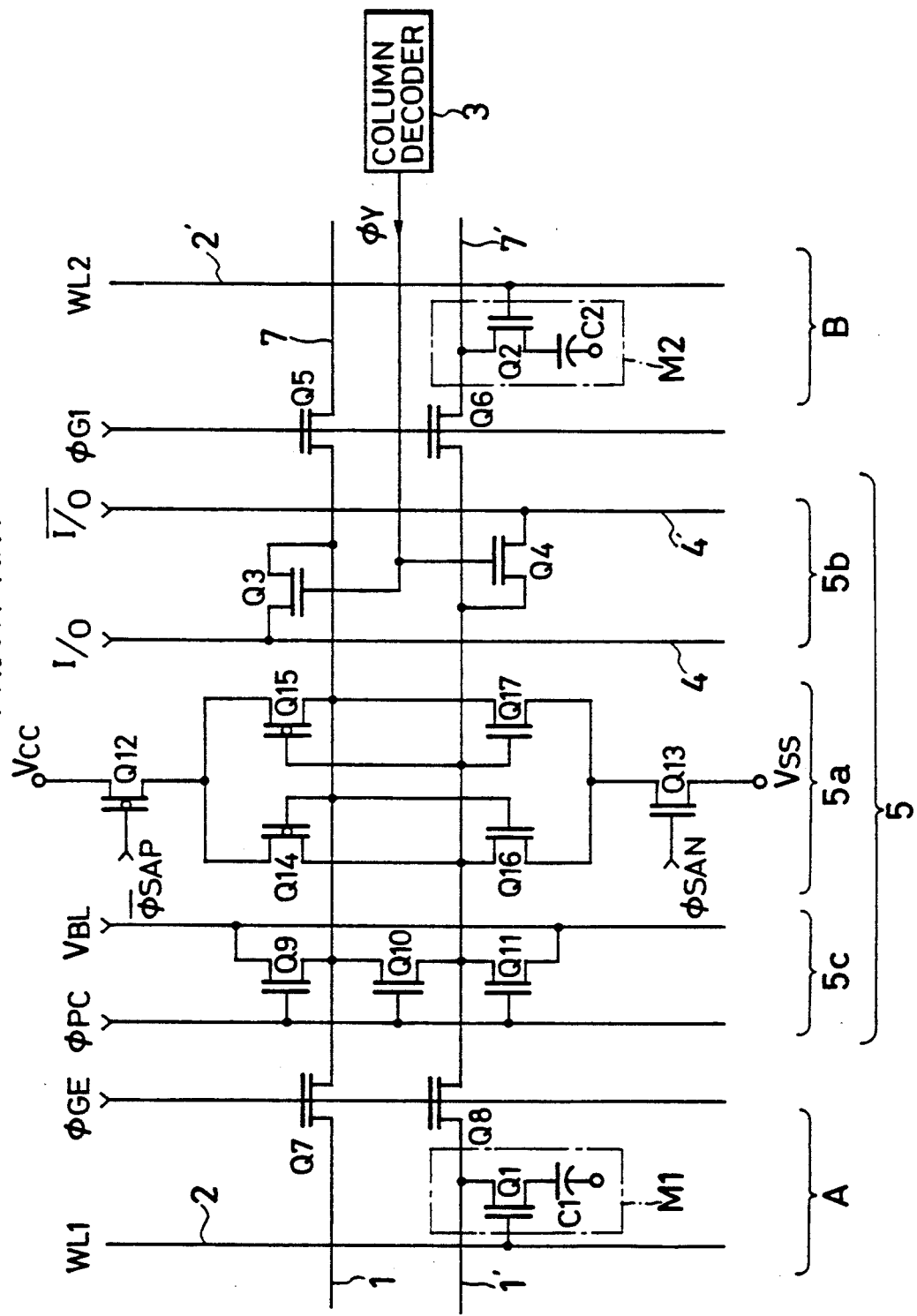
FIG. 1 is wiring diagram showing part of MOS dynamic RAM having a conventional shared sense amplifier configuration.
Figure 2:
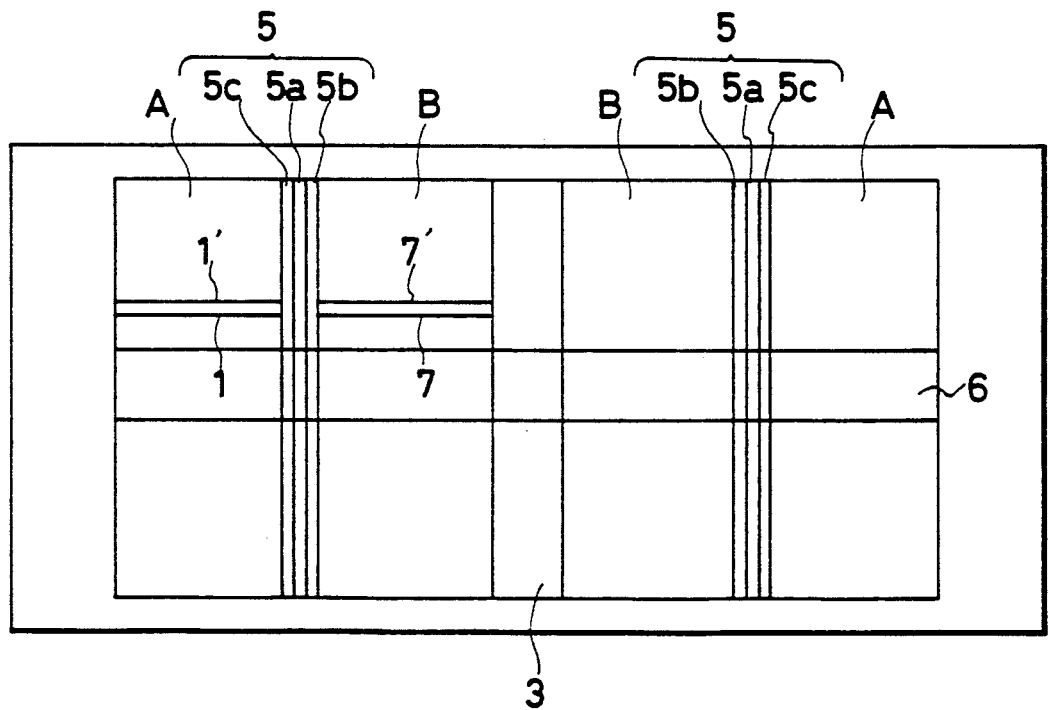
FIG. 2 shows a chip architecture of the MOS dynamic RAM employing the sense amplifier configuration of FIG. 1.
Figure 3:
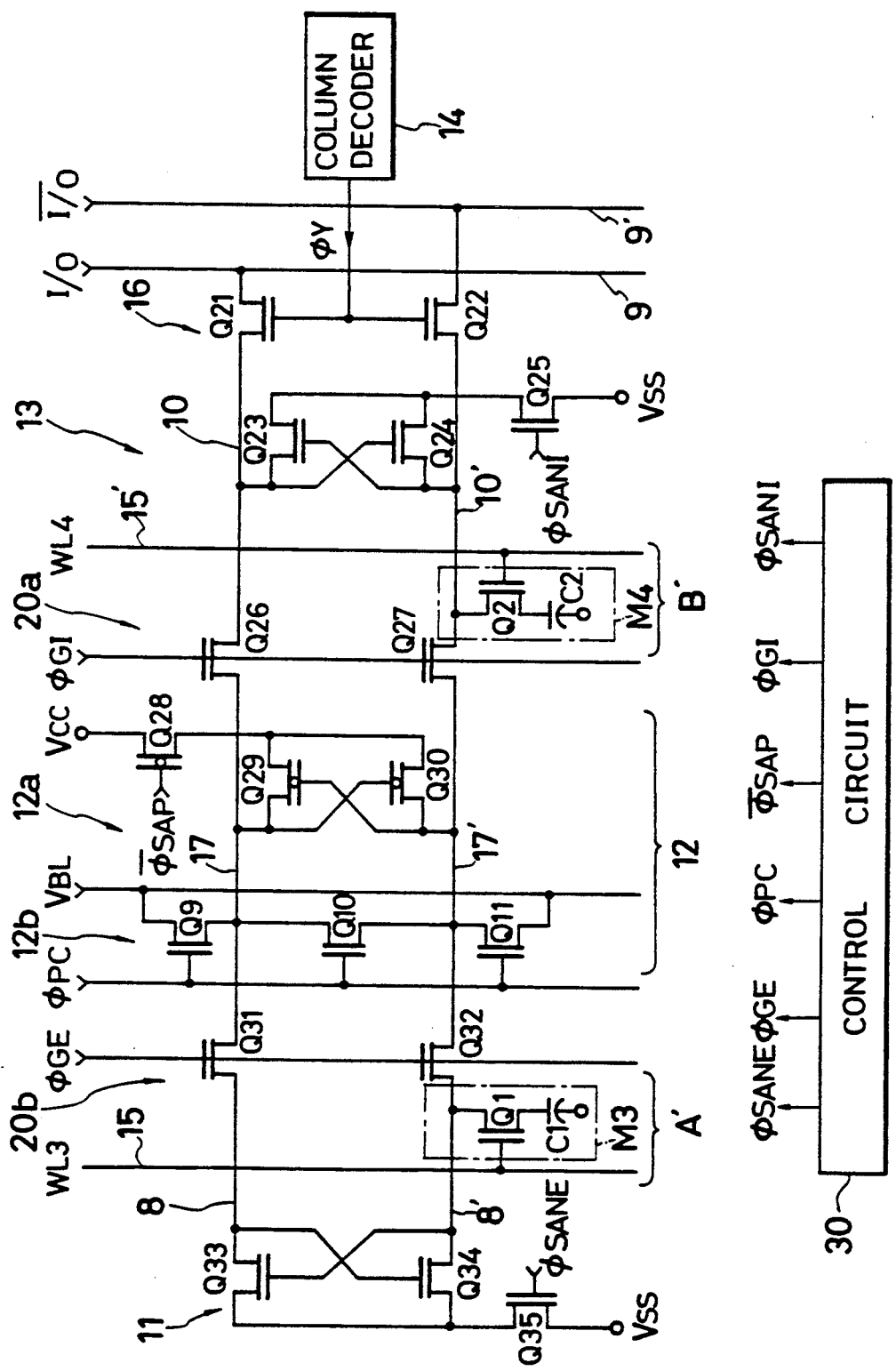
FIG. 3 is a wiring diagram showing part of a MOS dynamic RAM device of an embodiment of the invention.

FIG. 3 shows a MOS dynamic RAM device of an embodiment of the invention. It comprises a plurality of pairs of folded bit lines. Two pairs each of folded bit lines are interconnected through transfer gates described later to share part of a sense amplifier. In FIG. 3 only two pairs of interconnected folded bit lines 8, 8', 10, 10' are illustrated for the sake of simplicity.

The memory device further comprises a plurality of word lines extending orthogonal to the bit lines. Only two word lines 15, 15', one each for each pair of bit lines 8, 8', 10, 10' are illustrated.

A first flip-flop 11 formed of n-channel transistors Q33 and Q34 is disposed near "outer" ends (left ends as viewed in FIG. 3) of the folded bit lines 8, 8'. Its data nodes are connected to the bit lines 8, 8' and its power supply node is connected through a transistor Q35 to a first power supply (Vss).

A second flip-flop 13 formed of n-channel transistors Q23 and Q24 is disposed near outer ends (right ends as viewed in FIG. 3) of the folded bit lines 10, 10'. Its data nodes are connected to the bit lines 10, 10' and its power supply node is connected through a transistor Q25 to the first power supply (Vss).

A third flip-flop 12a formed of p-channel transistors Q29 and Q30 is disposed between "inner" ends of the bit lines 8, 8' and 10, 10'. The data nodes of the flip-flop 12a are connected to a pair of lines 17, 17', which in turn are connected through transfer gates Q31 and Q32 and Q26 and Q27 to the bit lines 8 and 8', and 10 and 10' and respectively. The power supply node of the flip-flop 12a is connected through a transistor Q28 to a second power supply (Vcc).

This bit line configuration can be viewed in the following way: A first original bit line, extending along a straight line on the chip surface layout, is divided by two transfer gates Q31 and Q26 into three parts 8, 17, 10. Similarly, a second original bit line, extending along a straight line and in parallel with the first original bit line on the chip surface layout is divided by two transfer gates Q32 and Q27 into there parts 8', 17', 10'. The first parts 8, 8' form a first pair of bit lines and are connected to data nodes of the flip-flop 11. The second parts 17, 17' are connected to the data nodes of the flip-flop flop 12a. The third parts 10, 10' form a second pair bit lines and are connected to data nodes of the flip-flop 13.

Memory cells such as M3 connected to the first parts such as those 8, 8' of the original bit lines form a first block A' and memory cells such as M4 connected to the third parts such as those 10, 10' of the original bit lines form a second block B'.

A precharge circuit 12b comprising transistors Q9, Q10 and Q11 is connected to precharge the lines 17, 17' to a voltage VBL when the transistors Q9, Q10 and Q11 are on. The bit lines 8, 8' and 10, 10' are also precharged if the transfer gates Q31, Q32, Q26, Q27 are on. The precharge voltage $V_{BL}$ is a value midway between the value for "1" and "0".

I/O lines 9, 9' extending orthogonal to the bit lines are disposed to extend adjacent the outer ends of the bit lines 10, 10'.

A column decoder 14 is disposed near the outer ends of the bit lines 10, 10' and beyond the I/O lines 9, 9'. I/O gates 16 are formed of the transistors Q21 and Q22 which are made conductive in responsive to a column address signal $\phi_Y$ from the column decoder 14 to transfer data between the bit lines and the I/O lines. The I/O gates are positioned between the flip-flop 13 and the column decoder 14.

A control circuit 30 is provided to produce the signals $\phi_{PC}$, $\phi_{GE}$, $\phi_{GI}$, $\phi_{SANE}$, $\phi_{SANI}$ and $\overline{\phi_{SAP}}$.

Figure 4:
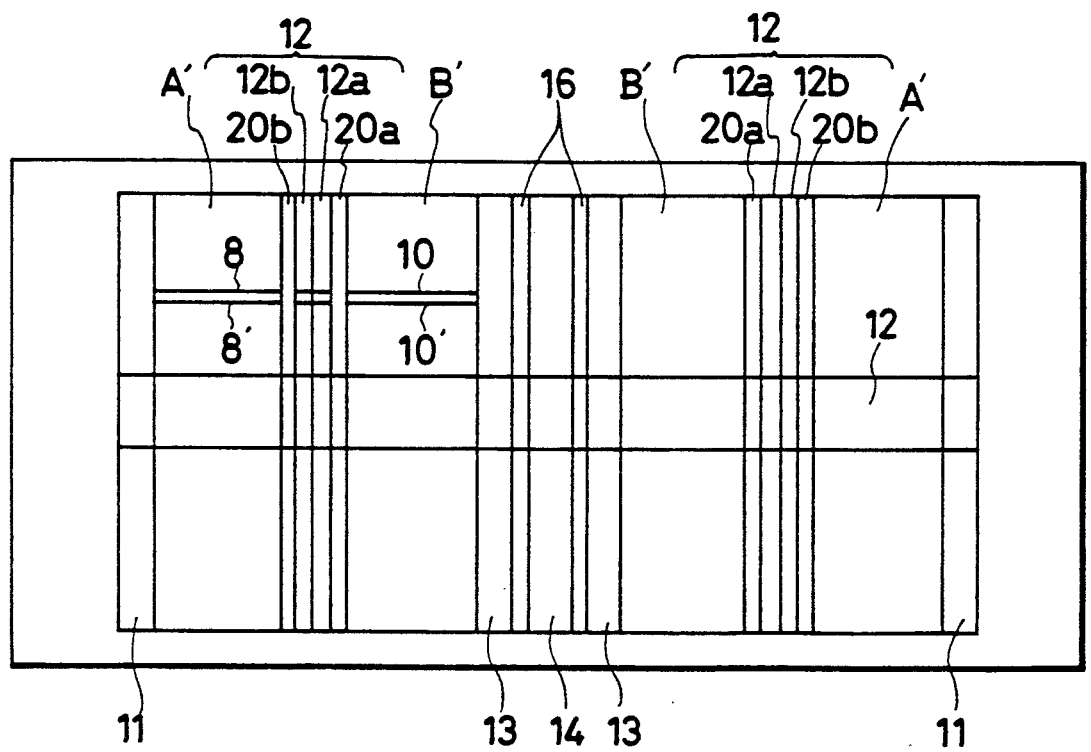
FIG. 4 shows a chip architecture of the MOS dynamic RAM of FIG. 3.

FIG. 4 is a block diagram showing a chip architecture of the MOS dynamic RAM incorporating the shared sense amplifier configuration of FIG. 3. As illustrated, the area of the chip includes an area 12 which is further divided into an area 12a for the flip-flops also denoted by 12a, an area 12b for the precharge circuit, areas 20a, 20b for the transfer gates. Areas 11 and 13 are for the n-channel sense amplifiers.

The operation of the above memory device will now be described. The memory device operates either in a first mode in which a memory cell M3 in the first block A' is accessed, or in a second mode in which a memory cell M4 in the second block B' is accessed.

Figure 5:
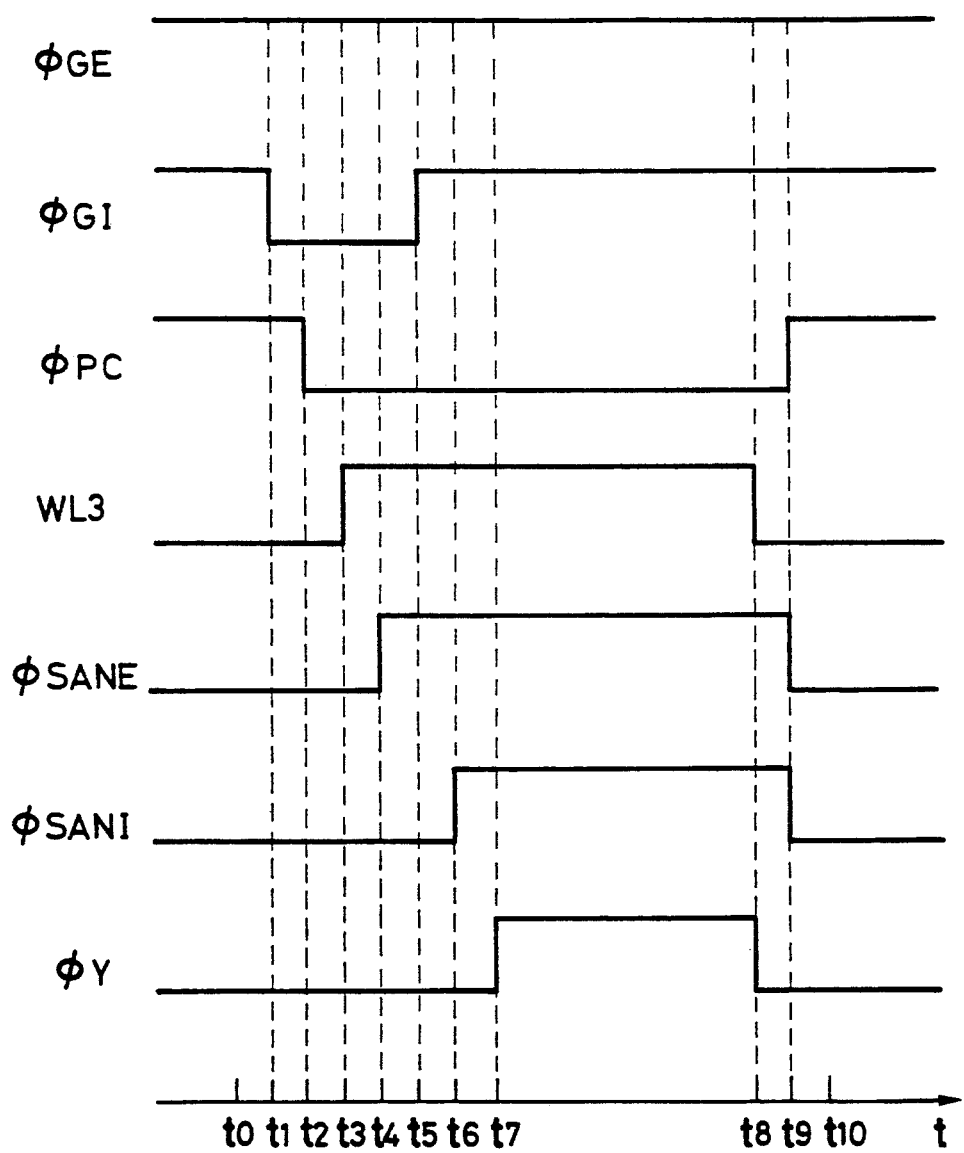
FIGS. 5 and 6 are timing charts showing operations of the MOS dynamic RAM of FIG. 3.
Figure 6:
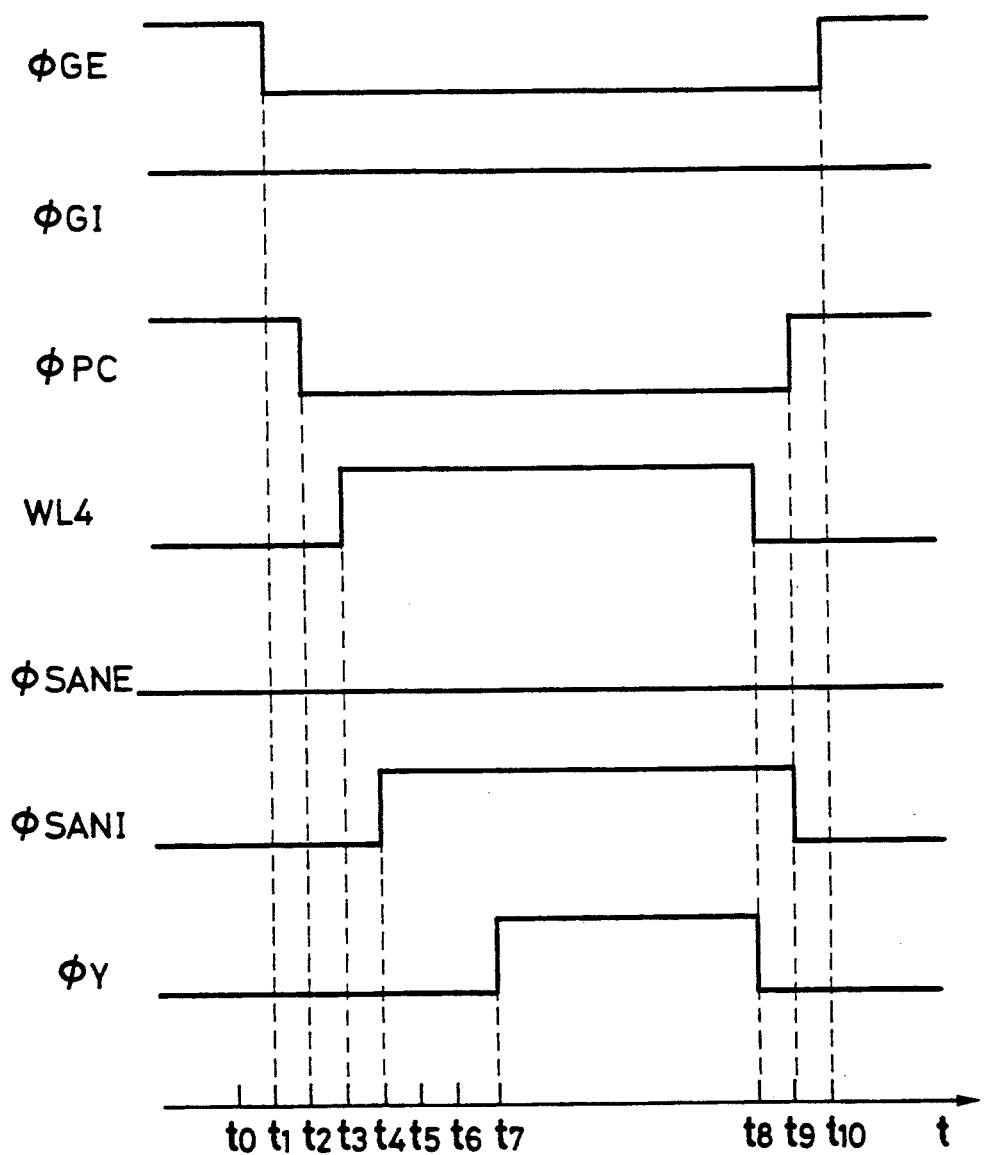

FIG. 5 and FIG. 6 are timing charts showing various clocks applied to the memory device. FIG. 5 shows a case in which the first block A' is accessed, while FIG. 6 shows a case in which the second block B' in selected.

[1] Where a memory cell in the first block A' is accessed (FIG. 5)

At time $t=t_0$, the bit lines 8, 8', 10, 10' are precharged to a level $V_{BL}$. At $t=t_1$, the signal $\phi_{GI}$ goes low to turn off the transistors Q26, Q27, so that the bit lines 10, 10' are disconnected. Subsequently, at $t=t_2$, $\phi_{PC}$ goes low and the precharging and equalization of the bit lines 8, 8' are terminated. At $t=t_3$, the potential on the word line 15 rises and the data in the memory cell M3 is read out.

At $t=t_4$, the signal $\phi_{SANE}$ goes high to activate the flip-flop 11, and the signal $\overline{\phi_{SAP}}$ (not shown) substantially simultaneously goes low to activate the flip-flop 12a. The data from the memory cell M3 is therefore amplified on the bit lines 8, 8', to Vss=OV and (Vcc−Vth) V. Here, Vth represents threshold voltage of the transistor (Q31 or Q32) forming the transfer gate.

At $t=t_5$, the signal $\phi_{GI}$ goes high to turn on the transistors Q26 and Q27, so that the amplified data is transferred to the bit lines 10, 10'. At $t=t_6$, the flip-flop 13 is activated by the signal $\phi_{SANI}$ going high, so that the data on the bit lines 10, 10' is also amplified to OV and (Vcc−Vth) V. Subsequently, at $t=t_7$, the signal $\phi_Y$ goes high and the data is transferred to the I/O lines 9, 9'.

When data which is an inversion of the data which has been just read out is to be written, the bit lines and the flip-flops have to be inverted. Suppose that the data stored in the memory cell M3 is "0" and the new data to be written is "1". When the data is read out of the memory cell M3, the bit lines 8' and 8 become "0" and "1" respectively. The data "0" and "1" on the bit lines 8' and 8 are transmitted through the lines 17' and 17, and the bit lines 10' and 10 to the I/O lines 9' and 9. This is accomplished along the process described above. When new data "1" which is an inversion of the data "0" that has been read out is to be written into the memory cell M3, data "1" and "0" are transmitted through the I/O lines 9' and 9, respectively, and the data are passed through the transistors Q21 and Q22 onto the bit lines 10' and 10. Then, the flip-flop 13 formed of the transistors Q23 and Q24 is inverted, and the flip-flop 13 amplifies the new data "1" and "0" on the bit lines 10' and 10. The amplified data are passed through the gates Q26 and Q27 and the flip-flop 12a is inverted. The flip-flop 12a amplifies the new data "1" and "0" on the lines 17' and 17. The amplified data are then passed further through the gates Q31 and Q32 to the bit lines 8 and 8'. The flip-flop 11 is then inverted, and the flip-flop 11 amplifies the new data "1" and "0" on the bit lines 8' and 8. The amplified new data on the bit lines 8' is then written in the memory cell M3.

The flip-flop 13 formed of n-channel transistors generally has a driving power greater than the flip-flop 12a formed of p-channel transistors of the same size, so that it can be inverted. But there can occur a racing between flip-flops 11 and 13 formed of the same n-channel transistors of the same size, and the writing of the inverse data may fail, or it takes a long time for the sensing. It is therefore desirable that the flip-flop 13 closer to the I/O gates has a greater driving power than the flip-flop 11 farther away from the I/O gates. This can be implemented by forming the transistors to have differrent sizes. More specifically, the transistors of the flip-flop 13 have large sizes than the transistors of the flip-flop 11, so that writing of inverse data in the block 7 is facilitated.

[2] When a memory cell in the block B' is accessed (FIG. 6)

At t=$t_0$, the operation is the same as in the case where a memory cell in the block A' is accessed. At t=$t_1$, the signal $\phi_{GE}$ goes low, so that the transfer gates Q31 and Q32 are turned off and the bit lines 8, 8' are disconnected. At t=$t_2$, the signal $\phi_{PC}$ goes low, so that the precharging and the equalization of the bit lines 10, 10' are terminated. At t=$t_3$, the potential on the word line 15' rises and the data in the memory cell M4 is read out. At t=$t_4$, the signal $\phi_{SANI}$ goes high to activate the flip-flop 13, and at about the same time, the signal $\overline{\phi_{SAP}}$ goes low to activate flip-flop 12a, so that the data from the memory cell is amplified to 0V and (Vcc−Vth) V. Subsequently, at t=$t_7$, the signal $\phi_Y$ goes high, and the data is transferred to the I/O lines 9, 9'.

The writing can be accomplished in a manner similar to that described in connection with the prior art. There is no such problem of racing as is encountered when writing in the block A'.

In the embodiment described, only the flip-flop 12a is shared and two flip-flops formed of the n-channel transistors are provided. Alternatively, it may be so arranged that only a flip-flop formed of n-channel transistors is shared and a flip-flop formed of the p-channel transistors is provided for each pair of bit lines. Similar results are still obtained.

Because of the features described above, the present invention has the following advantages.

The I/O gates 16 are disposed adjacent the column decoder 14, so that it is not necessary to dispose a column address signal line for the column address signal $\phi_Y$ to extend between the bit lines, or to form such a signal line using a separate conductor layer.

Moreover, in contrast to a prior art in which the data read out of the memory cell must pass through the transistors Q7, Q8, or Q5, Q6 before being amplified, the data read out at the memory cell is first amplified by the flip-flop 11 or 13 before passing through any gate, so that the "sense" sensitivity is higher in the present invention.

The I/O gates are provided in the block B', so that data read out of the block A' must pass two successive gates. But this is not a disadvantage as the flip-flop 13 is effective to amplify the data.

Since the flip-flop formed of p-channel transistors and the flip-flops formed of n-channel transistors are disposed far from each other in terms of layout, the pattern layout design is easier.

The high level on the bit lines is up to (Vcc−Vth) V, as in the prior art, and the flip-flop formed of p-channel transistors and the flip-flops formed of n-channel transistors are disposed far from each other, and are separated by transfer gate transistors. Therefore, the "totem pole-current" through the flip-flop 12a and flip-flop 11 or 13 is reduced because of the additional impedance of the transfer gate. "Totem pole current" means any one of: a current through Q29 of the flip-flop 12a and Q33 of the flip-flop 11, a current through Q30 of the flip-flop 12a and Q34 of the flip-flop 11, a current through Q29 of the flip-flop 12a and Q23 of the flip-flop 13, and a current through Q30 of the flip-flop 12a and Q24 of the flip-flop 13. Moreover, because the bit lines need to be charged to Vcc−Vth, lower than Vcc, the power required for the charging is reduced.

Furthermore, according to the invention, the bit lines and the I/O lines do not intersect each other, so that they can be formed of the same wiring conductor layer.

According to the invention, the number of the flip-flops formed of n-channel transistors is twice that of the prior art arrangement. But as the transistors Q33, Q34, Q23, Q24 can be made smaller than the corresponding transistors of the prior art arrangement, the total chip area can be made about the same as the prior art.

According to the present invention, the precharge level of the bit line is:

$$V_{BL} = (Vcc - Vth)/2$$

This is approximately equal to the precharged level for the bit lines when the word lines are not boosted and the potentials of the signals written in the memory cell are either 0V or Vcc−Vth'. Here, Vth' is the threshold voltage of the memory cell transistor. But it is approximately equal to Vth. Since the dummy level can be set at a value midway between the data voltage values Vcc−Vth' and 0 as read out from the memory cell, the "sense" sensitivity is improved, and an improvement is also made in connection with soft error, etc.

The flip-flops 11 and 13 directly connected to the folded bit line pairs have difference sizes and hence different driving powers in such a way that the flip-flop 13 provided on the same bit line pair as the I/O gates has greater sizes than the flip-flop 11 provided on the other bit line pair, writing of inverse data (inverse to the data that has been read out) is facilitated.

What is claimed is:

1. A metal oxide semiconductor (MOS) dynamic random access memory comprising:

first and second pairs of folded bit lines each having first ands second ends;

a first group of a plurality of memory cells connected to said first pair of folded bit lines;

a second group of a plurality of memory cells connected to said second pair of folded bit lines;

a first flip-flop having a pair of data nodes and a power supply node, said nodes being connected to the first ends of said first pair of folded bit lines;

first power supply means coupled to said power supply node of said first flip-flop;

a second flip-flop having a pair of data nodes and a power supply node, said nodes being connected to the first ends of said second pair of folded bit lines, and said power supply node of said second flip-flop being coupled to said first power supply means;

a third flip-flop having a pair of data nodes and a power supply node;

second power supply means coupled to said power supply node of said third flip-flop;

a first pair of transfer gates, each of said gates having first and second terminals;

a second pair of transfer gates, each of said gates having first and second terminals;

a pair of intermediate lines, said pair of date nodes of said third flip-flop being connected to said pair of intermediate lines, said pair of intermediate lines connected to said first terminals of said first and second pair of transfer gates;

said second terminals of said first pair of transfer gates being connected to said second ends of said first pair of folded bit lines;

said second terminals of said second pair of transfer gates being connected to said second ends of said second pair of folded bit lines;

a third pair of transfer gates, each having first and second terminals, the first terminals of said third pair of transfer gates being connected to the first ends of said second pair of folded bit lines;

a pair of input/output lines connected to second terminals of said third pair of transfer gates;

control means for issuing at least first and second control signals for accessing information from a memory cell in said first and second groups of memory cells, respectively, said first control signal for connecting said first flip-flop via said first pair of transfer gates with said third flip-flop to form a first sense amplifier to amplify information contained in a memory cell in said first group and communicating information of a memory cell in said first group to said pair of input/output lines, and said second control signal for connecting said second flip-flop via said second pair of transfer gates with said third flip-flop to form a second sense amplifier to amplify information contained in a memory cell in said second group and communicating information of a memory cell in said second group to said pair of input/output lines;

a first activating switch for connecting said power supply node of said first flip-flop with said first power supply means, a second activating switch for connecting said power supply node of said second flip-flop with said first power supply means, and a third activating switch for connecting said power supply node of said third flip-flop to said second power supply means; wherein said control means also issues a third control signal, a fourth control signal, and a fifth control signal, and said first through fifth control signals are timed to be issued such that when a memory cell in said second group is accessed, said second pair of transfer gates controlled by said second control signal is kept on;

said second activating switch is controlled by said fourth control signal and said third activating switch is controlled by said fifth control signal to be turned on concurrently, while the first pair of transfer gates controlled by said first control signal and said first activating switch controlled by said third control signal are kept off; and when a memory cell in said first group is accessed, said first pair of transfer gates controlled by said first control signal is kept on;

said first activating switch controlled by said third control signal and said third activating switch controlled by said fifth control signal are turned on while said second pair of transfer gates controlled by said second control signal and said second activating switch controlled by said fourth control signal are off;

and thereafter, said second pair of transfer gates is controlled by said second control signal and said second activating switch is controlled by said fourth control to turn on so as to transfer data between a selected one of said first and second groups of memory cells and said input/output lines.

2. The MOS dynamic random access memory of claim 1, wherein said control means issues a first auxiliary signal concurrent with said first control signal for triggering said first pair of transfer gates to connect said first flip-flop with said third flip-flop, and a second auxiliary signal concurrent with said second control signal for triggering said second pair of transfer gates to connect said second flip-flop with said third flip-flop.

3. The MOS dynamic random access memory of claim 1, wherein control means issues a third control signal concurrent with both said first and second control signals to trigger said third pair of transfer gates to connect said pair of input/output lines with, on the one hand, said first pair of folded bit lines, and on the other hand, said second pair of folded bit lines.

4. The MOS dynamic access memory of claim 1, wherein said first and said second flip-flops are formed of n-channel transistors and said third flip-flop is formed of p-channel transistors.

5. The MOS dynamic random access memory of claim 1, wherein said second flip-flop is positioned more proximate to said input/output lines than said first flip-flop, and said second flip-flop has a higher driving power than said first flip-flop to facilitate writing of data inverse to that read out from a memory cell in said second group.

6. The MOS dynamic random access memory of claim 1, wherein said first and second transfer gates are formed of n-channel MOS transistors.

* * * * *